United States Patent
Cesaretti et al.

(10) Patent No.: US 12,367,135 B1
(45) Date of Patent: Jul. 22, 2025

(54) CIRCUIT HAVING START UP TRIMMING

(71) Applicant: Allegro MicroSystems, LLC, Manchester, NH (US)

(72) Inventors: Juan Manuel Cesaretti, Buenos Aires (AR); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 15 days.

(21) Appl. No.: 18/615,267

(22) Filed: Mar. 25, 2024

(51) Int. Cl.
*G06F 12/00* (2006.01)
*G06F 12/02* (2006.01)

(52) U.S. Cl.
CPC .................. *G06F 12/0238* (2013.01)

(58) Field of Classification Search
CPC .... G06F 12/0238; G01D 5/14; G01D 5/2448; G01D 5/2449; G01R 33/0035
See application file for complete search history.

(56) References Cited

U.S. PATENT DOCUMENTS

| | | | |
|---|---|---|---|
| 7,093,151 B1* | 8/2006 | Williams | G06F 1/04 713/600 |
| 7,715,219 B2 | 5/2010 | Monreal | |
| 8,339,134 B2 | 12/2012 | Chen et al. | |
| 8,451,002 B2 | 5/2013 | Chen et al. | |
| 8,542,011 B2 | 9/2013 | Chen et al. | |
| 8,717,794 B2 | 5/2014 | Cambou et al. | |
| 9,218,879 B2 | 12/2015 | Cambou et al. | |
| 10,038,001 B1 | 7/2018 | Wang | |
| 10,297,605 B2 | 5/2019 | Wang | |
| 10,706,948 B2 | 7/2020 | Biberidis et al. | |
| 11,169,877 B2 | 11/2021 | Rigoni et al. | |
| 11,170,858 B2 | 11/2021 | Sarwar et al. | |
| 11,327,882 B2 | 5/2022 | Sarwar et al. | |
| 2016/0139199 A1* | 5/2016 | Petrie | G01R 33/07 324/750.3 |
| 2017/0030980 A1* | 2/2017 | Kosier | G01R 33/07 |
| 2021/0157669 A1* | 5/2021 | Rigoni | G06F 11/1004 |

* cited by examiner

*Primary Examiner* — Shawn X Gu

(74) *Attorney, Agent, or Firm* — DALY, CROWLEY, MOFFORD & DURKEE, LLP

(57) ABSTRACT

Method and apparatus for trimming IC components. In an embodiment, a circuit includes a digital controller, a first programmable read only memory coupled to the controller, and a trimmable block having at least one trimmable component. A second programmable read only memory is coupled to the trimmable block, where the second programmable read only memory is independent of the first programmable read only memory.

18 Claims, 6 Drawing Sheets

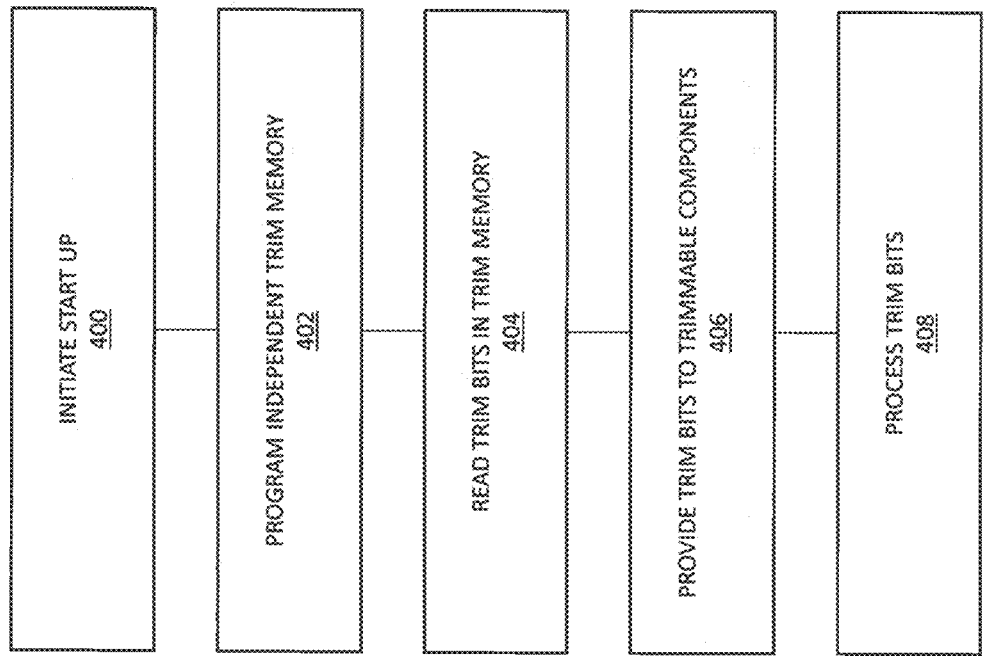

CIRCUIT HAVING START UP TRIMMING

BACKGROUND

As is known, integrated circuit (IC) packages may contain circuitry that requires a startup process to achieve proper operation. Some circuits require trimming of one or more components due to, for example, processing variation. Oscillators have a nominal operating frequency that can vary, such as by +/−20%. Some conventional circuits may set the oscillator frequency to a minimum value to enable startup of digital circuitry. Other components may not have such an option. Some known circuits require memory access to obtain one or more trim values. However, memory access may not be possible without startup of certain digital circuitry. Thus, proper startup of a circuit may be challenging.

FIG. 1 shows an example prior art circuit 10 including a digital controller 12 coupled to a charge pump 14 and memory 16, shown as EEPROM. The controller 12 is also coupled to a trimmable block 18 that contains one or more components to which trim data is provided. It is understood that a variety of components may have accuracy and/or operating characteristics that can be improved using trimming, such as by laser trimming, and/or trimming data from one-time programming (OTP), and/or multiple-time programming (MTP, for example EEPROM).

After startup, the digital controller 12 provides the trim information obtained from the EEPROM 16 to the trimmable block 18. It may be problematic for circuit components that need to have their trimmed configuration available at startup since the digital controller 12 and/other digital circuitry may need to be up and running to obtain the information from the EEPROM 16. Example components that may need trim information include (under voltage lock out) UVLOs, POKs, voltage regulators, and the like. The normal sequential nature of the EEPROM access logic requires a working oscillator to drive a digital controller which constrains the nature and value of the oscillator trimming bits, e.g., the oscillator needs to start at its minimum possible frequency and then, once the trimming bits are read, set its final trimmed frequency.

SUMMARY

Example embodiments of the disclosure provide methods and apparatus for providing trim data from a memory to a component without a digital controller. In embodiments, a system includes first and second programmable read only memories and a trimmable block coupled to the second programmable read only memory. One or more components in the trimmable block can access the trim data during startup without involving a digital controller.

In one aspect, a system comprises: a digital controller; a first programmable read only memory coupled to the controller; a trimmable block having at least one trimmable component; and a second programmable read only memory coupled to the trimmable block, wherein the second programmable read only memory is independent of the first programmable read only memory, and wherein the second programmable read only memory comprises trim data bits.

A system can further include one or more of the following features: an access circuit to read the trim data bits in the second programmable read only memory, the access circuit provides the trim data bits read from the second programmable read only memory to the at least one trimmable component, the access circuit comprises an analog circuit, the access circuit does not include a clock signal, the digital controller coupled to the second programmable read only memory, wherein the digital controller is not needed to access the second programmable read only memory, the second programmable read only memory is accessible during startup of the digital controller, the digital controller is coupled to the second programmable read only memory and configured to access the second programmable read only memory after startup, and/or the at least one trimmable component comprises an oscillator and at least one data bit of the trim data bits in the second programmable read only memory comprises trim data for frequency adjustment of the oscillator.

In another aspect, a method comprises: coupling a digital controller to a first programmable read only memory; providing a trimmable block having at least one trimmable component; and coupling a second programmable read only memory coupled to the trimmable block, wherein the second programmable read only memory is independent of the first programmable read only memory, and wherein the second programmable read only memory comprises trim data bits.

A method can further include one or more of the following features: an access circuit to read the trim data bits in the second programmable read only memory, the access circuit provides the trim data bits read from the second programmable read only memory to the at least one trimmable component, the access circuit comprises an analog circuit, the access circuit does not include a clock signal, the digital controller coupled to the second programmable read only memory, wherein the digital controller is not needed to access the second programmable read only memory, the second programmable read only memory is accessible during startup of the digital controller, the digital controller is coupled to the second programmable read only memory and configured to access the second programmable read only memory after startup, and/or the at least one trimmable component comprises an oscillator and at least one data bit of the trim data bits in the second programmable read only memory comprises trim data for frequency adjustment of the oscillator.

BRIEF DESCRIPTION OF THE DRAWINGS

The foregoing features of the disclosure, as well as the disclosure itself may be more fully understood from the following detailed description of the drawings, in which:

FIG. 4 shows an example sequence of steps for providing independent programmable read only memory accessible by trimmable components.

DETAILED DESCRIPTION

Figure 1:
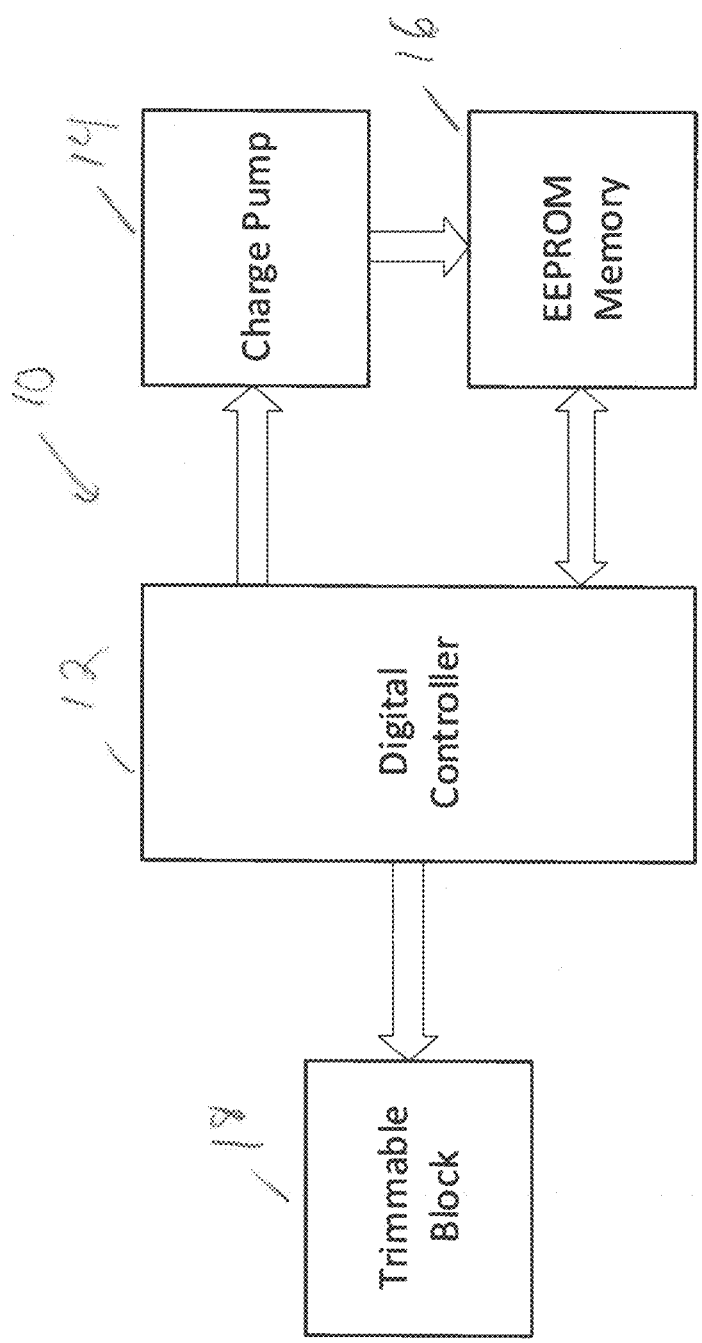
FIG. 1 shows a prior art circuit having programmable read only memory accessed by a digital controller to access trim data.
Figure 2:
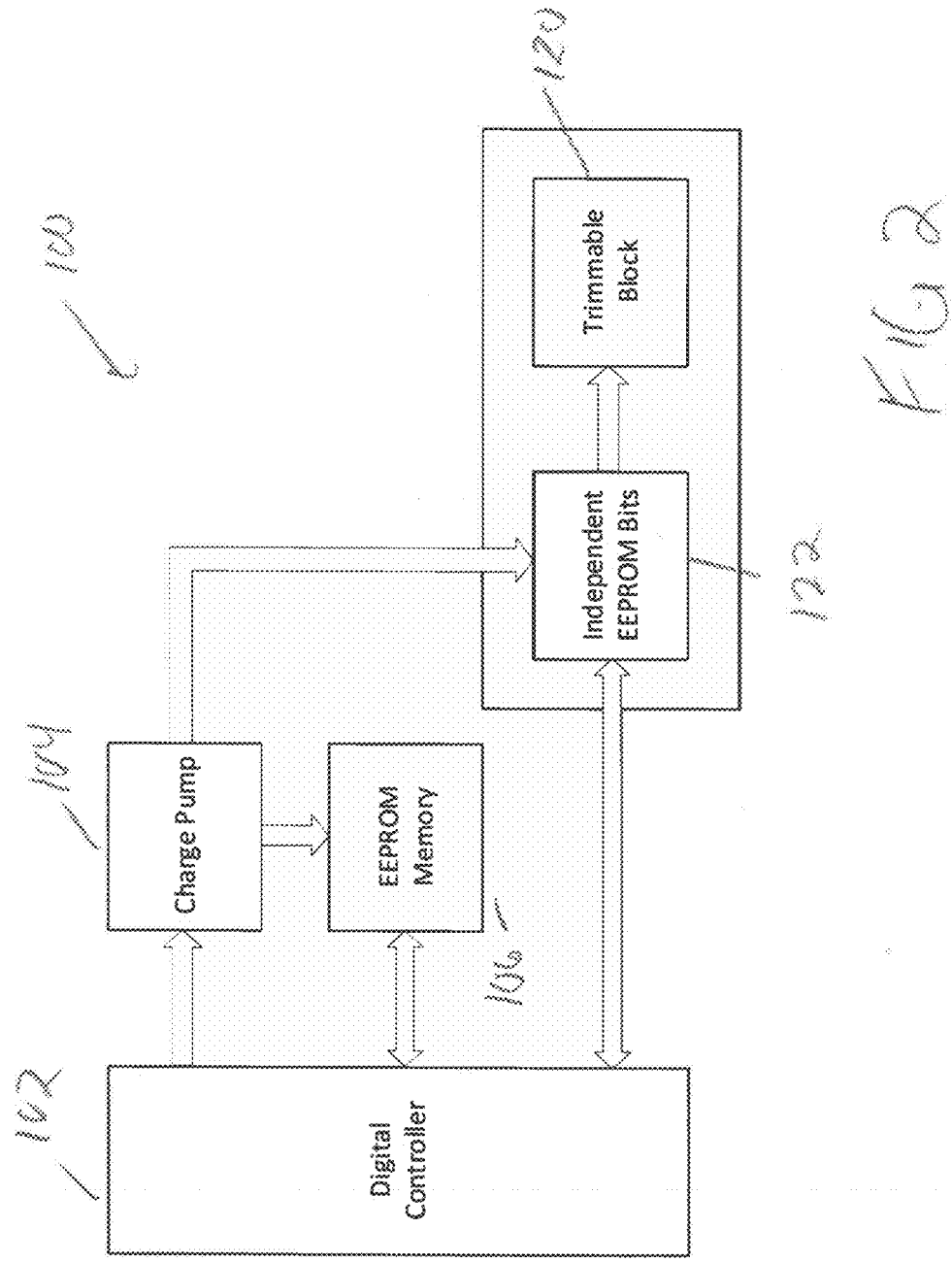
FIG. 2 shows an example circuit having an independent programmable read only memory accessible by trimmable components.

FIG. 2 shows an example circuit 100 including a digital controller 102 coupled to a charge pump 104 and first programmable read only memory (PROM) 106, such as EEPROM. The circuit further includes a trimmable block 120 coupled to a second programmable read only memory 122, which can comprise EEPROM. In the illustrated embodiment, the second programmable read only memory 122 is coupled to the controller 102 and is independent from the first programmable read only memory 106. In some embodiments, a charge pump 104 is coupled to the controller 102, the first memory 106, and the second memory 122. It is understood that the charge pump 122, which is optional, is useful in systems requiring high voltages for (programming memory, such as EEPROM. In other embodiments this high voltage may be provided through a connection to external sources. For memory readout operations, a charge pump is normally not required.

The second programmable read only memory 122 may comprise bits that are independently programmed, erased, and read. With relatively low bit counts, a single readout of the second programmable read only memory 122 is provided with simpler programming and reading logic. In the illustrated embodiment, the digital controller 102 is not needed to access the second programmable read only memory 122 or to pass along data bits to the trimmable block 120 since these bits are interpreted directly by the trimmable block 102. With this arrangement, components in the trimmable block 102 can be configured at startup by trim data prior to and/or independent of operation of the controller 102. During normal operation, the controller 102 may access the data in the second programmable read only memory 122.

In embodiments, data bits in the second programmable read only memory 122 are available in fully static read access since no oscillator or special timing sequence is required for readout. This means that combinational-only logic and biasing circuitry are needed in the readout of the secondary memory to avoid having time-dependent, sequential patterns required for memory access, such as delays, one-shot pulses, trains of pulses, etc., where oscillators or other forms of analog delay may not be accessible or have uncertain or inaccurate (untrimmed) values.

It is understood that some processing technologies do not have simple one-time programming (OTP) options, requiring more complex memories like EEPROM or Flash. Conventional circuits in such technologies do not include providing trim information to trimmable components until after startup, which is potentially problematic. For example, a circuit may be designed to generate a voltage output of 3V. Process variations result in an actual output voltage level of 3V +/−20% which result in errors or poor performance or even an inability to successfully startup. Also, it may be desirable to trim voltage regulators at start up to operate at a given voltage level or provide accurate threshold voltage levels, some of which may be safety critical. In applications where very fast power-up times are needed, it may be desirable to enable the operation of safety-critical modules without waiting for a full startup sequence involving a digital processor, as they usually require multiple clock cycles to complete their boot sequence and readout of the entire memory of the device. Moreover, internal functional safety features may need accurate circuitry to enable efficient monitors of various subsystems. An inability to trim such components until after full start up, if proper operation can be safely achieved at all, is undesirable. That is, relying upon the digital controller 102 to finish start up to access memory may not be feasible. For example, reading the first programmable read only memory 106 may require an oscillator operating at a given frequency for successful read operations by the digital controller 102. If the oscillator initially operates at frequency margins, read operations by the controller may not retrieve correct data.

Figure 3:
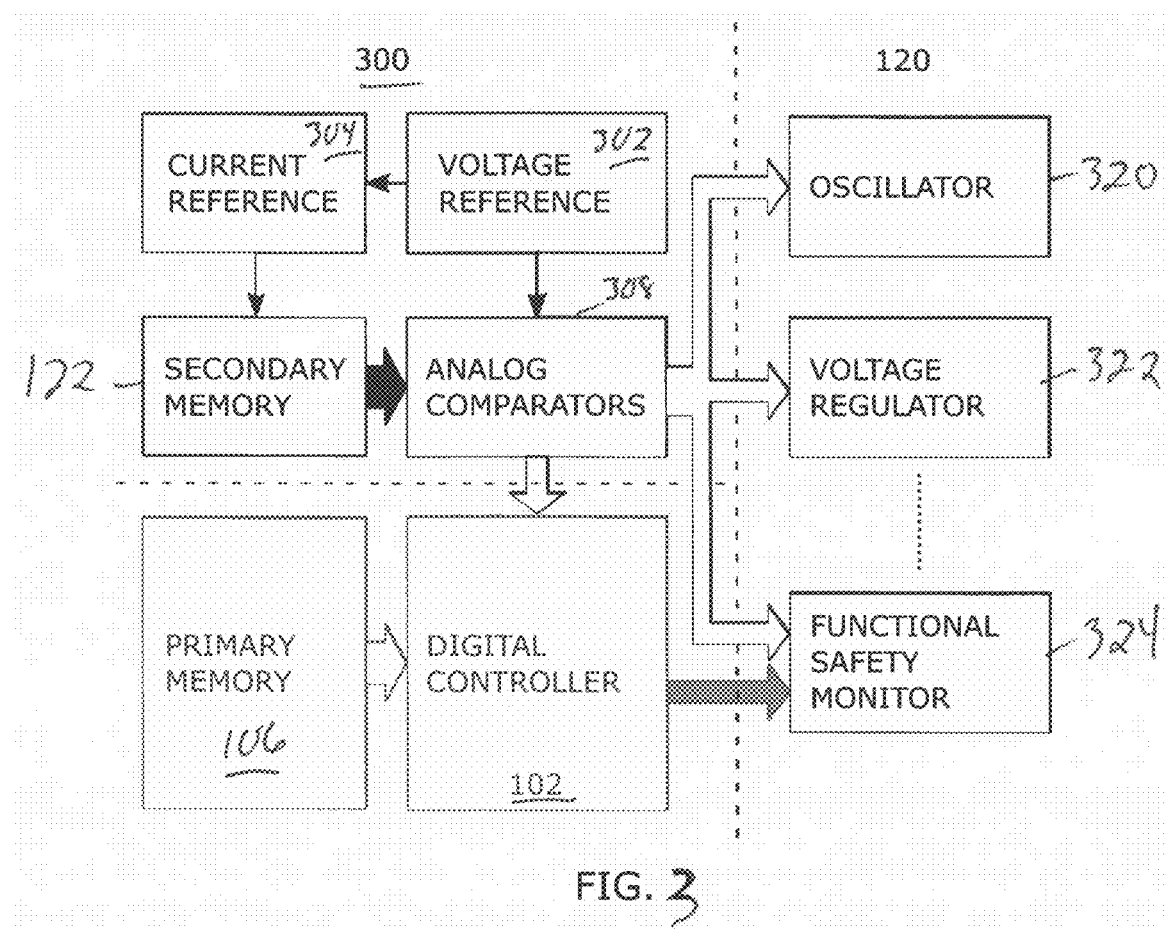
FIG. 3 is a block diagram and FIG. 3A is an example circuit for accessing the independent programmable read only memory of FIG. 2.
Figure 3A:
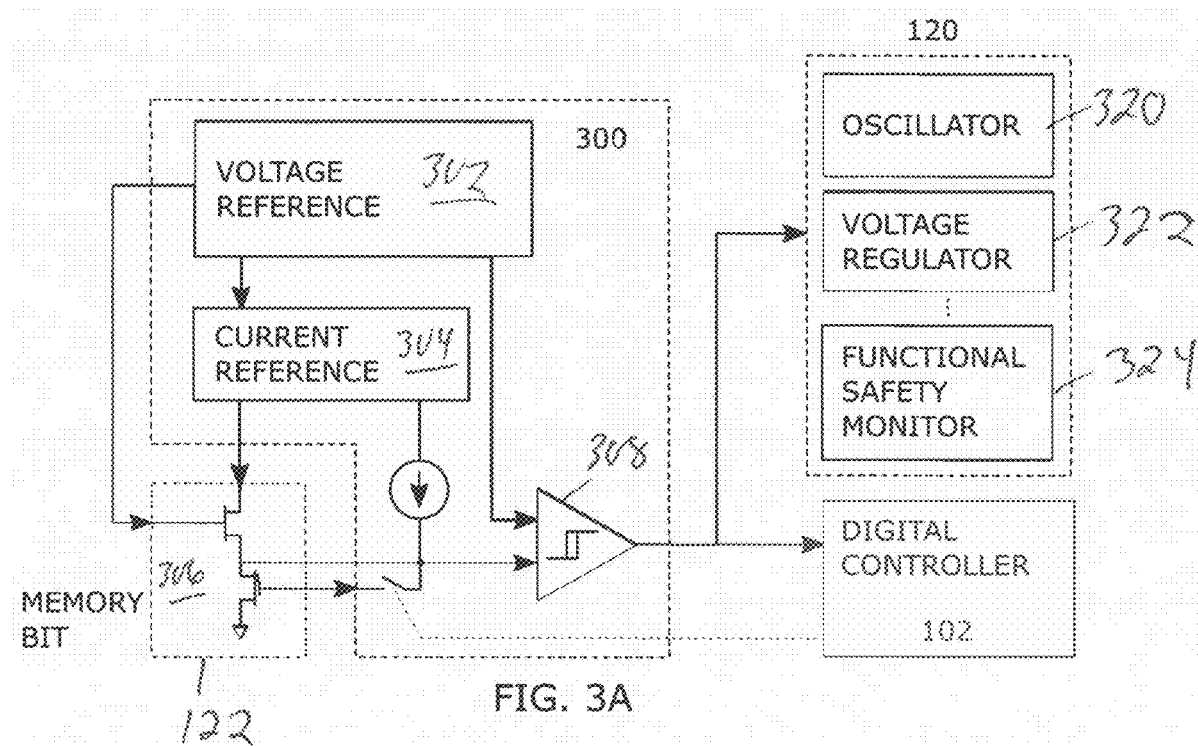

FIG. 3 shows an example block diagram and FIG. 3A shows an example implementation of an example analog access circuit 300 for accessing data in the second programmable read only memory 122 of FIG. 2. In the illustrated embodiment, the access circuit 300 includes a voltage reference 302 connected to a current reference 304 both of which are coupled to a switch network 306. In embodiments, the access circuit 300 includes a comparator 308 to determine whether a given bit output from the switch network 306 in the second programmable read only memory 122 is a ONE or a ZERO. The access circuit 300 provides the trim data to a given component, such as an oscillator or voltage regulator. In embodiments, the access circuit 300 does not include and/or does not need a clock signal to access data in the second programmable read only memory 122.

With this arrangement, the access circuit 300 can access trim data for use by components in the trimmable block 120 during startup, e.g., prior to the digital controller 102 being operational. Trimmable components, such as oscillators 320, voltage regulators 322, safety monitors 324, and the like, can be trimmed, during startup. Further trimming may even be performed using data in a main programmable memory, for example, during normal operation of the circuit well after startup.

Figure 3B:
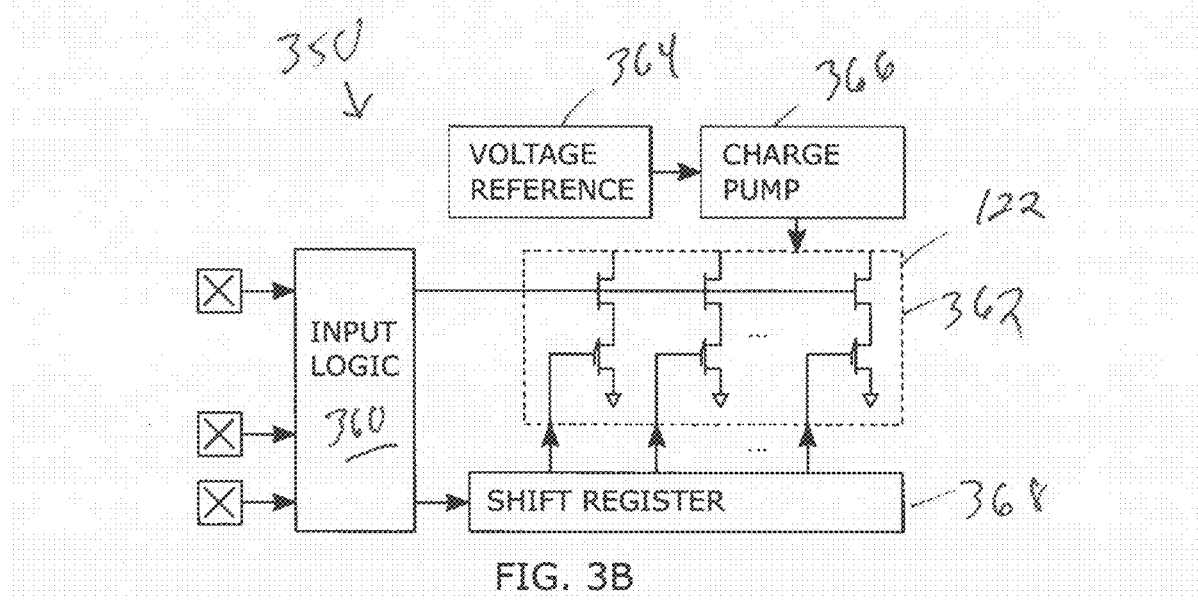
FIG. 3B is a schematic representation of an example circuit for programming memory bits in independent memory without a direct digital controller.

FIG. 3B depicts an exemplary circuit 350 to allow programming of the secondary memory during the startup phase without requiring the functionality of the oscillator or the digital controller. An input logic 360 enables the programming mode of the secondary memory 362 which may eventually require a high voltage 364 provided externally or through a charge pump 366, and feeds the appropriate logic state into a shift register 368 to select which bits of the secondary memory 122 will be set to ONE or ZERO. The loading of the shift register 368 can be performed through clocking logically generated from the input signals or, in some applications by an internal oscillator.

It is understood that normally operations such as PROGRAMMING require proper startup of a digital controller to determine which bits of an independent memory are to be set to ONE or ZERO. FIG. 3B shows an example circuit to arrange the independent bits to be programmed without a digital controller and still use EEPROM or Flash for that secondary memory, by means of input to external processors (e.g. by setting the logic desired state through a probing pad)

FIG. 4 shows an example sequence of steps for providing independent programmable read only memory accessible by trimmable components. In step 400, startup of a circuit is initiated. In step 402, if not already programmed, independent trim memory can be programmed. In step 404, during startup trim data bits are read and provided to one or more components in a trimmable block in step 406. In embodiments, an analog circuit accesses the trim data bits and provides the trim data to the trimmable components. A digital controller is not involved in accessing the independent trim data bits during startup. In step 408, the trimmable components can process the trim data for reconfiguration of some operating characteristic. For example, trim data may adjust the frequency of an oscillator or voltage level of a regulator.

Figure 5:
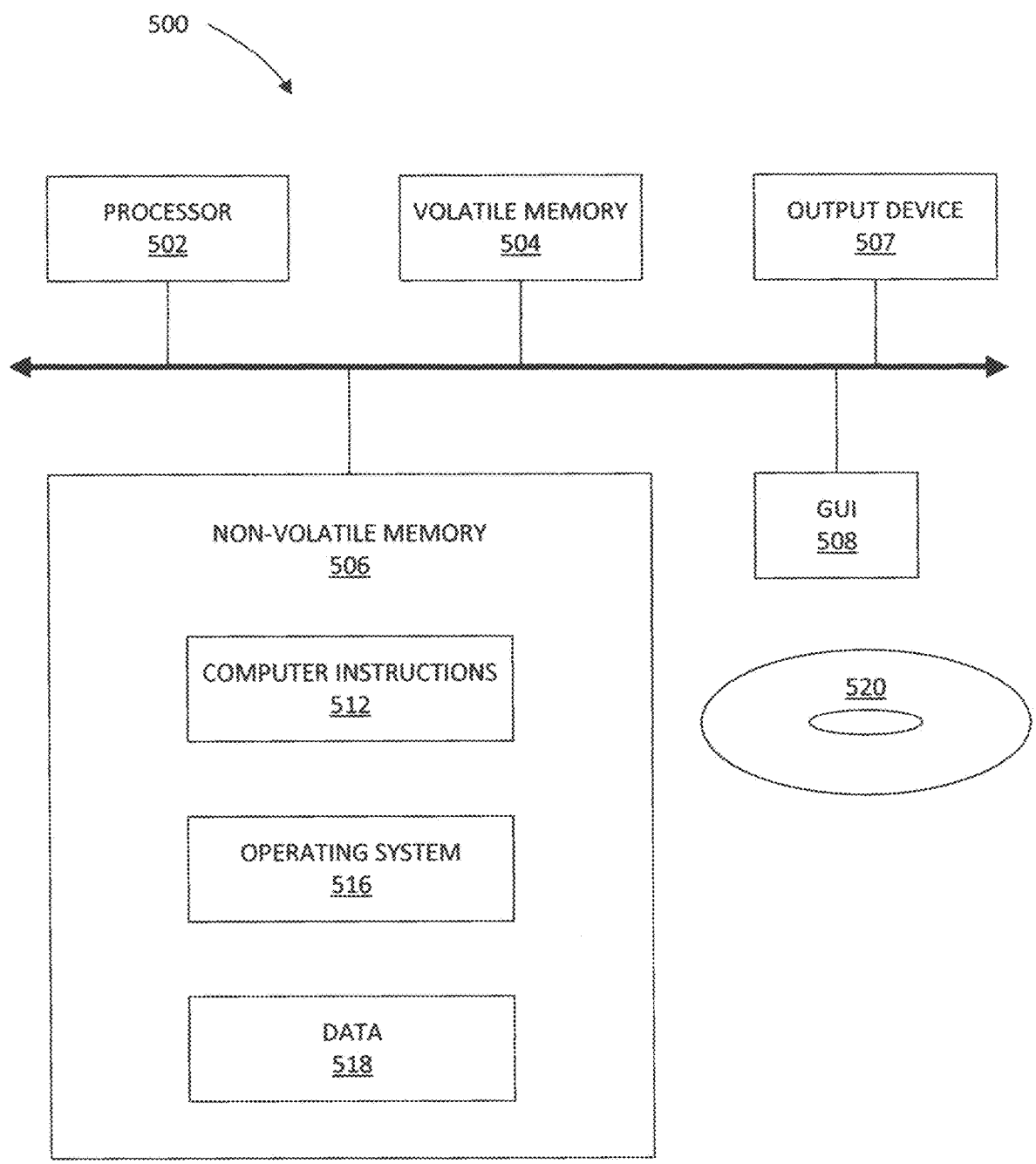
FIG. 5 is a schematic representation of a computer or microcontroller that can perform at least a portion of the processing described herein.

FIG. 5 shows an exemplary computer 500 that can perform at least part of the processing described herein. The computer 500 includes a processor 502, a volatile memory 504, a non-volatile memory 506 (e.g., hard disk), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

All references cited herein are hereby incorporated herein by reference in their entirety. Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A system, comprising:
   a digital controller;
   a first programmable read only memory coupled to the controller;
   a trimmable block having at least one trimmable component; and
   a second programmable read only memory coupled to the trimmable block, wherein the second programmable read only memory is independent of the first programmable read only memory, and wherein the second programmable read only memory comprises trim data bits.

2. The system according to claim 1, further including an access circuit to read the trim data bits in the second programmable read only memory.

3. The system according to claim 2, wherein the access circuit provides the trim data bits read from the second programmable read only memory to the at least one trimmable component.

4. The system according to claim 3, wherein the access circuit comprises an analog circuit.

5. The system according to claim 4, wherein the access circuit does not include a clock signal.

6. The system according to claim 1, further including the digital controller coupled to the second programmable read only memory, wherein the digital controller is not needed to access the second programmable read only memory.

7. The system according to claim 6, wherein the second programmable read only memory is accessible during startup of the digital controller.

8. The system according to claim 7, wherein the digital controller is coupled to the second programmable read only memory and configured to access the second programmable read only memory after startup.

9. The system according to claim 1, wherein the at least one trimmable component comprises an oscillator and at least one data bit of the trim data bits in the second programmable read only memory comprises trim data for frequency adjustment of the oscillator.

10. A method, comprising:
    coupling a digital controller to a first programmable read only memory;
    providing a trimmable block having at least one trimmable component; and
    coupling a second programmable read only memory coupled to the trimmable block, wherein the second programmable read only memory is independent of the first programmable read only memory, and wherein the second programmable read only memory comprises trim data bits.

11. The method according to claim 10, further including employing an access circuit to read the trim data bits in the second programmable read only memory.

12. The method according to claim 11, wherein the access circuit provides the trim data bits read from the second programmable read only memory to the at least one trimmable component.

13. The method according to claim 12, wherein the access circuit comprises an analog circuit.

14. The method according to claim 13, wherein the access circuit does not include a clock signal.

15. The method according to claim 10, further including coupling the digital controller to the second programmable read only memory, wherein the digital controller is not needed to access the second programmable read only memory.

16. The method according to claim 15, wherein the second programmable read only memory is accessible during startup of the digital controller.

17. The method according to claim 16, wherein the digital controller is coupled to the second programmable read only memory and configured to access the second programmable read only memory after startup.

18. The method according to claim 10, wherein the at least one trimmable component comprises an oscillator and at least one data bit of the trim data bits in the second programmable read only memory comprises trim data for frequency adjustment of the oscillator.

\* \* \* \* \*